United States Patent
Lei

(10) Patent No.: US 12,027,539 B2
(45) Date of Patent: Jul. 2, 2024

(54) PIXEL UNIT, SENSOR AND SENSING ARRAY

(71) Applicant: Ningbo Abax-Sensing Electronic Technology Co., Ltd., Ningbo (CN)

(72) Inventor: Shuyu Lei, Ningbo (CN)

(73) Assignee: Ningbo Abax-Sensing Electronic Technology Co., Ltd., Ningbo (CN)

( * ) Notice: Subject to any disclaimer, the term of this patent is extended or adjusted under 35 U.S.C. 154(b) by 509 days.

(21) Appl. No.: 17/295,964

(22) PCT Filed: Oct. 9, 2019

(86) PCT No.: PCT/CN2019/110215
§ 371 (c)(1),
(2) Date: May 21, 2021

(87) PCT Pub. No.: WO2020/103594
PCT Pub. Date: May 28, 2020

(65) Prior Publication Data
US 2022/0005852 A1    Jan. 6, 2022

(30) Foreign Application Priority Data
Nov. 22, 2018 (CN) .......................... 201811399529.X

(51) Int. Cl.
*H01L 27/146*    (2006.01)

(52) U.S. Cl.
CPC .. *H01L 27/14603* (2013.01); *H01L 27/14643* (2013.01)

(58) Field of Classification Search
CPC ........... H01L 27/14609; H01L 27/1461; H01L 27/14612; H01L 27/14614;
(Continued)

(56) References Cited

U.S. PATENT DOCUMENTS

| 5,949,061 A * | 9/1999 | Guidash | ............... H04N 25/766 |
| | | | 348/E3.018 |
| 6,511,883 B1 * | 1/2003 | Pan | ......................... H01L 31/18 |
| | | | 438/270 |

(Continued)

FOREIGN PATENT DOCUMENTS

| CN | 101211954 A | 7/2008 |
| CN | 104282707 A | 1/2015 |

(Continued)

OTHER PUBLICATIONS

International Search Report, Application No. PCT/CN2019/110215, mailed Jan. 7, 2020, 4 pages.

*Primary Examiner* — Eduardo A Rodela
(74) *Attorney, Agent, or Firm* — Ziegler IP Law Group

(57) ABSTRACT

The present application provides a pixel unit, a sensor and a sensing array. The pixel unit includes a charge collecting area configured to receive radiation to generate photo-generated charge; a transmission gate connected between the charge collecting area and a floating diffusion node and configured to transfer the photo-generated charge from the charge collecting area to the floating diffusion node; an electric potential adjustment area disposed at a periphery of the charge collecting area and configured to concentrate the photo-generated charge to a side of a connection between the charge collecting area and the transmission gate.

9 Claims, 4 Drawing Sheets

(58) Field of Classification Search
CPC ......... H01L 27/14616; H01L 27/14638; H01L 27/14603; H01L 27/14643
See application file for complete search history.

(56) References Cited

U.S. PATENT DOCUMENTS

| | | | |
|---|---|---|---|
| 10,134,792 B2* | 11/2018 | Lee | H01L 27/1461 |
| 11,855,105 B2* | 12/2023 | Kawahara | H01L 27/14623 |
| 2006/0187327 A1* | 8/2006 | Mabuchi | H01L 27/14632 |
| | | | 348/294 |
| 2010/0133638 A1* | 6/2010 | Park | H01L 27/14629 |
| | | | 257/E31.124 |
| 2015/0155327 A1* | 6/2015 | Kuboi | H01L 27/14689 |
| | | | 257/292 |

FOREIGN PATENT DOCUMENTS

| | | |
|---|---|---|
| CN | 104835825 A | 8/2015 |
| KR | 100868632 B1 | 11/2008 |

* cited by examiner

PIXEL UNIT, SENSOR AND SENSING ARRAY

CROSS-REFERENCE TO RELATED APPLICATIONS

The present application claims priority of Chinese patent application No. CN201811399529.X, filed with the Chinese Patent Office on Nov. 22, 2018 and titled pixel unit, sensor and sensing array, the entire content of which is incorporated in the present application by reference.

FIELD OF THE INVENTION

The present application relates to the field of microelectronics technology, more specifically to a pixel unit, a sensor, and a sensing array.

BACKGROUND OF THE INVENTION

This part of content is intended to provide a background or context to the embodiments of the present invention illustrated in the claims. The following description should not be deemed as prior art just because it is involved in this part.

Currently, complementary metal oxide semiconductor (CMOS) sensor has attracted attention due to its low cost and better suitability for mass production; such as commonly used CMOS sensors include CMOS sensors based on photodiode structures, and the like. In scenario of measuring a long distance and with high-precision, since light travels fast, a CMOS sensor is required to have a high response speed and high precision, for example, a CMOS sensor is required to have a response time of tens of nanoseconds, so that to make sure the CMOS sensor being able to receive reflected radiation in time.

Due to the planarization of the internal potential in the traditional photodiode structure, charge is transferred mainly relying on diffusion movement. However the transferring is slow and the efficiency of the transferring is low, which thus leads to image trailing. In the traditional photodiode structure, the efficiency of charge transferring will directly affect the response speed and the measurement accuracy of the photoelectric sensor.

In order to overcome the above-mentioned drawbacks existing in the traditional photodiode structure, the prior art usually creates a modulated electric field by using non-uniform doping to accelerate the lateral transferring of charges. However the non-uniform doping is a complicated manufacturing process and the control over the production of the photodiode is also difficult.

SUMMARY OF THE INVENTION

Since the prior art adopts non-uniform doping to create a modulated electric field to accelerate the lateral transferring of charge, where the non-uniform doping is a complicated manufacturing process and the control over the production of photodiode is also difficult. Therefore it is urgent to design a technical solution to solve the above-mentioned drawbacks. The present application is expected to provide a pixel unit, a sensor and a sensing array.

A first aspect of the present application provides a pixel unit, which includes a charge collecting area configured to receive radiation to generate photo-generated charge; a floating diffusion node configured to store and output the photo-generated charge generated in the charge collecting area; a transmission gate connected between the charge collecting area and the floating diffusion node and configured to transfer the photo-generated charge from the charge collecting area to the floating diffusion node; an electric potential adjustment area disposed at a periphery of the charge collecting area and configured to concentrate the photo-generated charge to a side of a connection between the charge collecting area and the transmission gate.

In one embodiment of the present application, the electric potential adjustment area is composed of a polycrystalline resistor and the shape of the polycrystalline resistor is strip or blocky.

In one embodiment of the present application, if the electric potential adjustment area is composed of a plurality of blocky polycrystalline resistors, the plurality of blocky polycrystalline resistors are interconnected through a metal conductor, or there is no interconnection between the plurality of blocky polycrystalline resistors.

In one embodiment of the present application, a power source is connected to the electric potential adjustment area. The electric potential adjustment area includes at least two sub-adjustment areas. Where a connection between the at least two sub-adjustment areas is at earth potential. Optionally, the at least two sub-adjustment areas are arranged symmetrically.

In one embodiment of the present application, if the electric potential adjustment area is composed of the plurality of blocky polycrystalline resistors and the metal conductor, the number of the power source will thus be one. The power source is respectively connected to one end of the at least two sub-adjustment areas closed to the transmission gate.

In one embodiment of the present application, if the electric potential adjustment area is composed of the plurality of blocky polycrystalline resistors and there is no connection between the plurality of blocky polycrystalline resistors, the number of the power source will thus be plural. Different blocky polycrystalline resistors of the plurality of blocky polycrystalline resistors are connected to different power sources. The closer the blocky polycrystalline resistor is to the transmission gate, the greater a voltage of the power source connected to the closer blocky polycrystalline resistor is.

In one embodiment of the present application, if the electric potential adjustment area is composed of strip-shaped polycrystalline resistor and the number of a power source connected to the electric potential adjustment area is one, the electric potential adjustment area thus includes at least two sub-adjustment areas. The power source is respectively connected to one end of the at least two sub-adjustment areas closed to the transmission gate. A connection between the at least two sub-adjustment areas is at earth potential. Optionally, the at least two sub-adjustment areas are arranged symmetrically.

In one embodiment of the present application, the closer the distance between the electric potential adjustment area and the transmission gate is, the lower the potential is.

A second aspect of the present application provides a sensor. The sensor includes one or a plurality of any one of the pixel units of the first aspect.

A third aspect of the present invention provides a sensing array. The sensing array includes a plurality of sensors. The plurality of sensors may be the same as a plurality of any kinds of pixel units of the second aspect.

The technical solution provided by the present application forms a modulated electric field by arranging the electric potential adjustment area at the periphery of the charge collecting area so as to directionally transfer the photo-generated charge under the influence of the modulated electric field. This technical solution is able to improve the speed and the efficiency of the transferring, avoid image trailing, and improves the response speed and the measurement accuracy of the photoelectric sensor.

BRIEF DESCRIPTION OF THE DRAWINGS

By reading the following detailed description with reference to the accompanying drawings, the above and other objectives, features, and merits of the exemplary embodiments of the present application will become easy to understand. In the accompanying drawings, several embodiments of the present application are shown in an exemplary and non-limiting manner.

In the drawings, the same or corresponding reference numerals indicate the same or corresponding parts.

DETAILED DESCRIPTION OF ILLUSTRATED EMBODIMENTS

Figure 1A:
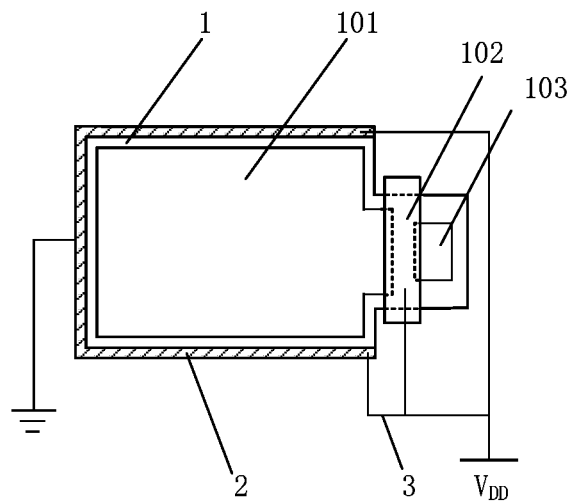
FIG. 1A is a schematic diagram showing an equivalent circuit of a pixel unit according to an embodiment of the present application.

The principle and spirit of the present application will be described below with reference to several exemplary embodiments. It should be understood that these embodiments are provided to enable those skilled in the art to better understand and then implement the application rather than limiting the scope of the application in any way. On the contrary, these embodiments are provided to make this application more thorough and complete, and to fully convey the scope of this application to those skilled in the art.

The applicant has noticed that the internal potential in the traditional photodiode structure is plane, charge is therefore transferred mainly relying on diffusion movement. However the transferring is slow and the efficiency of the transferring is low, which thus leads to image trailing and gives rise to adverse effect to the response speed and the measurement accuracy of the photoelectric sensor. In order to overcome these drawbacks existing in the traditional photodiode structure, the prior art usually creates a modulated electric field by using non-uniform doping to accelerate the lateral transferring of charges. However the non-uniform doping is a complicated manufacturing process and the control over the production of the photodiode is also difficult.

In order to overcome the drawbacks existing in the prior art, the present application provides a pixel unit, a sensor based on the pixel unit and a sensing array. The pixel unit includes a charge collecting area configured to receive radiation to generate photo-generated charge; a floating diffusion node configured to store and output the photo-generated charge generated in the charge collecting area; a transmission gate connected between the charge collecting area and the floating diffusion node and configured to transfer the photo-generated charge from the charge collecting area to the floating diffusion node; an electric potential adjustment area disposed at a periphery of the charge collecting area and configured to concentrate the photo-generated charge to a side of a connection between the charge collecting area and the transmission gate. The present application forms a modulated electric field by arranging the electric potential adjustment area at the periphery of the charge collecting area so as to directionally transfer the photo-generated charge under the influence of the modulated electric field. The present application is able to improve the speed and the efficiency of the transferring, avoid image trailing, and improves the response speed and the measurement accuracy of the photoelectric sensor.

The technical solution provided in the present application is applicable to scenarios of transferring charge in any devices, or scenarios of collecting charge in any devices. For example, the technical solution provided in the embodiments of the present application is applicable to scenarios of photo-generated charge transferring in ranging devices, or scenarios of photo-generated charge transferring in structured light devices, or scenarios of charge transferring in other devices, which is not limited in the embodiments of the present application. The photodiode structure in the pixel unit involved in the present application may be a front-illuminated type, a back-illuminated type, or any other types such as a stacked type, which is not limited in the present application.

After the introduction of the basic principle and the applicable scenarios of the present application, various non-limiting implementation manners of the present application will be specifically described as below.

A pixel unit according to an exemplary embodiment of the present application is described in combination with the application scenarios shown above as follows. It should be noted that the above-mentioned application scenarios are used to facilitate the understanding the spirit and principle of the present application rather than limiting the embodiments of the present application. On the contrary, the embodiments of the present application can be applied to any applicable scenarios.

An embodiment of the present application provides a pixel unit. The pixel unit at least includes a charge collecting area, a transmission gate, a floating diffusion node and an electric potential adjustment area. The charge collecting area is configured to receive radiation to generate photo-generated charge. The floating diffusion node is configured to store and output the photo-generated charge generated in the charge collecting area. The transmission gate is connected between the charge collecting area and the floating diffusion node and configured to transfer the photo-generated charge from the charge collecting area to the floating diffusion node. The electric potential adjustment area is disposed at a periphery of the charge collecting area and configured to concentrate the photo-generated charge to a side of a connection between the charge collecting area and the transmission gate. The pixel unit as shown in FIG. 1 forms a modulated electric field by arranging the electric potential adjustment area at the periphery of the charge collecting area so as to directionally transfer the photo-generated charge under the influence of the modulated electric field. Such operation is able to improve the speed and the efficiency of the transferring, avoid image trailing, and improves the response speed and the measurement accuracy of the photoelectric sensor.

In an embodiment of the present application, a sub-area, which has the lowest electric potential, has the shortest distance from the transmission gate. The closer the distance between the electric potential adjustment area and the transmission gate is, the lower the potential of the sub-area is. Therefore the photo-generated charge will be concentrated to the sub-area having the lowest electric potential and transferred from the sub-area having the lowest electric potential to the transmission gate so as to improve the speed and the efficiency of the transferring.

In an embodiment of the present application, the electric potential adjustment area further includes a ground point. Specifically speaking, a plurality of sub-areas having different electric potentials being arranged along a direction close to the transmission gate could be realized in a way that the sub-areas having different electric potentials are arranged along a direction from the ground point to the transmission gate.

In an embodiment of the present application, the pixel unit further includes a power source, which is connected to the electric potential adjustment area. Optionally, the power source is connected to the electric potential adjustment area via a wire, or the power source, the transmission gate and the electric potential adjustment area are interconnected via a wire. If there is one power source, the power source is thus connected to one sub-area or to the plurality of sub-areas in the electric potential adjustment area. If there are a plurality of power sources and the sub-areas in the electric potential adjustment area are divided into groups, voltages of the power sources connected to different groups of the sub-areas in the electric potential adjustment area are different. If there are a plurality of power sources and the sub-areas in the electric potential adjustment area are divided into groups, voltages of the power sources connected to the sub-areas in the same group in the electric potential adjustment area are the same. Preferably, the sub-areas in the same group are arranged symmetrically at the periphery of the charge collecting area.

In an embodiment of the present application, the power source is connected to the electric potential adjustment area. The electric potential adjustment area includes at least two sub-adjustment areas. A connection between the at least two sub-adjustment areas is at earth potential. The embodiments of the present application do not limit if the at least two sub-adjustment areas in the electric adjustment area are arranged symmetrically or asymmetrically.

In an embodiment of the present application, the electric potential adjustment area is composed of a polycrystalline resistor and the shape of the polycrystalline resistor is strip or blocky. The polycrystalline resistor, also known as polycrystalline silicon resistor, is a resistor formed by a poly layer of a MOS gate, therefore it is also called poly resistor. Optionally, the polycrystalline resistor may be realized by adopting ion implantation of small doses of impurities or by adding a further layer of mask. Since the manufacturing process of forming the electric potential adjustment area by adopting the polycrystalline resistor is simple, which therefore effectively reconciles drawbacks in the prior art such as the complication of the manufacturing process of creating the modulated electric field by using non-uniform doping and the difficulty of controlling the production of the photodiode, so as to reduce the difficulty of manufacturing the pixel unit. It should be understood that the embodiments of the present application do not limit the electric potential adjustment area to be other resistors apart from polycrystalline resistor, or limit the electric potential adjustment area to be consisted of other components besides resistors.

Implementations of the electric potential adjustment area will be described below in conjunction with drawings.

Implementation 1 provides an electric potential adjustment area composed of strip-shaped polycrystalline resistors. Specifically, if the electric potential adjustment area is composed of the strip-shaped resistors and the number of a power source connected to the electric potential adjustment area is one, the electric potential adjustment area thus includes at least two sub-adjustment areas. The power source is respectively connected to one end of the at least two sub-adjustment areas closed to the transmission gate. A connection between the at least two sub-adjustment areas is at earth potential. The embodiments of the present application do not limit the at least two sub-adjustment areas to be arranged symmetrically or asymmetrically. Since a resistance value of the strip-shaped polycrystalline resistors changes linearly, an electric potential in the charge collecting area surrounded by the strip-shaped polycrystalline resistors shows a linear downward trend along a direction of transferring charge in this implementation.

Example 1

Figure 1B:
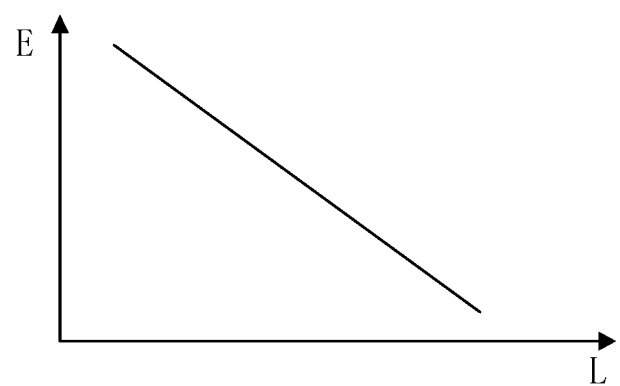
FIG. 1B is a schematic diagram showing an electric potential change trend in a charge collecting area according to an embodiment of the present application.

FIG. 1A is a schematic diagram showing an equivalent circuit of a pixel unit according to the embodiments of the present application. The pixel unit shown in FIG. 1A includes a charge collecting area 101, a transmission gate 102, a floating diffusion node 103, an electric potential adjustment area 2, a power source $V_{dd}$ and a ground point. The electric potential adjustment area 2 is a polycrystalline resistor. The electric potential adjustment area 2 is divided into two sub-areas. Two sub-adjustment areas are symmetrically arranged between the ground point and a connection of the transmission gate 102 in the electric potential adjustment area 2. The power source $V_{dd}$ in the pixel unit is respectively connected to one end of the two sub-adjustment areas in the electric potential adjustment area 2. An electric potential in the charge collecting area 101 shown in FIG. 1A shows a linear downward trend along a direction of transferring charge, which is shown in FIG. 1B.

Implementation 2 provides an electric potential adjustment area composed of blocky polycrystalline resistors, which may be realized in the following two ways.

In the first implementation, if the electric potential adjustment area is composed of a plurality of blocky polycrystalline resistors, the plurality of blocky polycrystalline resistors are thus interconnected through a metal conductor. Optionally, the metal conductor is connected between adjacent sub-areas in the electric potential adjustment area. Specifically, if the electric potential adjustment area is composed of the plurality of blocky polycrystalline resistors and the metal conductor, the number of the power source will thus be one. The power source is respectively connected to one end of the at least two sub-adjustment areas closed to the transmission gate. A resistance value of the metal conductor is smaller as compared to that of the polycrystalline resistor, which leads to gentle change in an electric potential of the charge collecting area between the metal conductors and slows down a change trend of the electric potential of the charge collecting area, so that the change of the electric potential of the charge collecting area shows a step downward trend. The embodiments of the present application is able to adjust the electric potential change between adjacent sub-areas through the metal conductor to control the transferring of the photo-generated charge.

Example 2

Figure 2A:
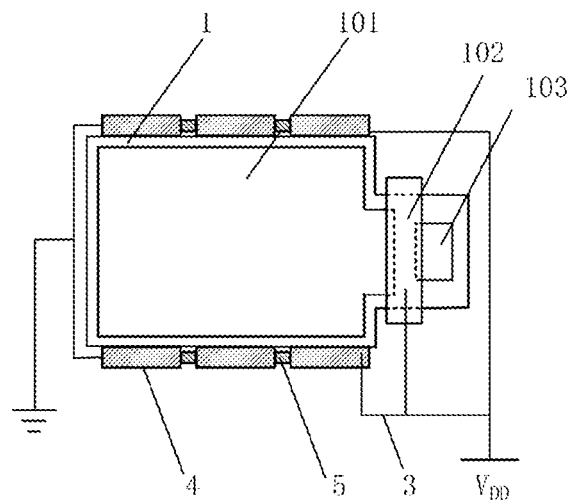
FIG. 2A is a schematic diagram showing an equivalent circuit of another pixel unit according to an embodiment of the present application.

FIG. 2A is a schematic diagram showing an equivalent circuit of another pixel unit according to the embodiments of the present application. The pixel unit shown in FIG. 2A includes a charge collecting area 101, a transmission gate 102, a floating diffusion node 103, an electric potential adjustment area, a metal conductor 5, a power source $V_{dd}$ and a ground point. The electric potential adjustment area is a polycrystalline resistor. The electric potential adjustment area is divided into six sub-areas 4. Adjacent sub-areas 4 in the six sub-areas 4 are interconnected through the metal conductor 5. The six sub-areas 4 are divided into two groups and arranged symmetrically on both sides of the electric potential adjustment area. The power source $V_{dd}$ is respectively connected to one end of the two sub-areas 4 closest to the transmission gate 102 among the six sub-areas 4.

Figure 2B:
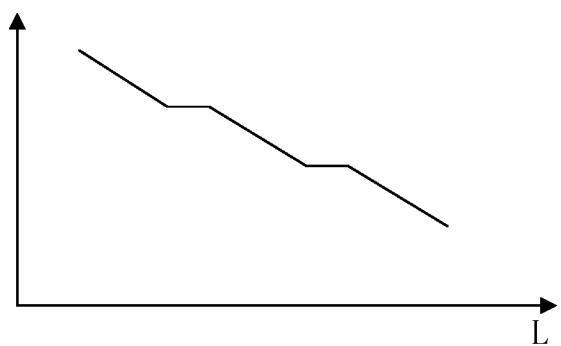
FIG. 2B is a schematic diagram showing an electric potential change trend in another charge collecting area according to an embodiment of the present application.

An electric potential change along the transferring direction of charge in the charge collecting area 101 shown in FIG. 2A shows a step downward trend, which is shown in FIG. 2B. It should be understood that a resistance value of the metal conductor 5 is smaller as compared to that of the polycrystalline resistor, which leads to gentle change in the electric potential of the charge collecting area 101 between the metal conductors 5 and slows down a change trend of the electric potential of the charge collecting area 101, so that the change of the electric potential of the charge collecting area 101 shows a step downward trend.

Implementation 2 provides that if the electric potential adjustment area is composed of a plurality of blocky polycrystalline resistors and there is no connection between the plurality of blocky polycrystalline resistors. Furthermore, if the electric potential adjustment area is composed of a plurality of blocky polycrystalline resistors and there is no connection between the plurality of blocky polycrystalline resistors, the number of the power source will thus be plural. Different blocky polycrystalline resistors of the plurality of blocky polycrystalline resistors are connected to different power sources. The closer the blocky polycrystalline resistor is to the transmission gate, the greater a voltage of the power source connected to the closer blocky polycrystalline resistor is. Due to the absence of the connection between the plurality of blocky polycrystalline resistors, the electric potential of the charge collecting area disposed between the polycrystalline resistors shows a downward trend, while the electric potential of the charge collecting area that is not between the polycrystalline resistors shows no change. Meanwhile, under the influence of a voltage of different power sources, the electric potential of the charge collecting area between different polycrystalline resistors is different, which gives rise to the electric potential of the charge collecting area showing a step downward trend.

Example 3

Figure 3A:
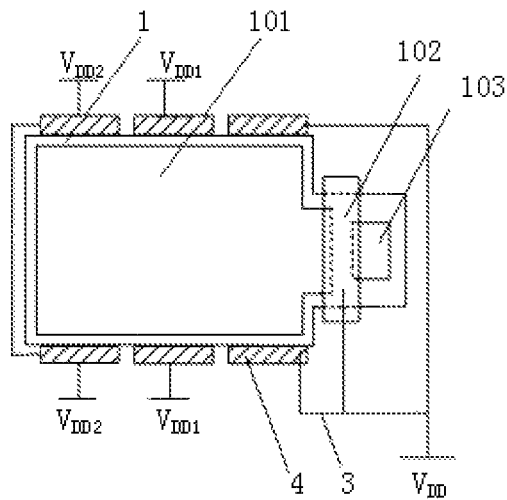
FIG. 3A is a schematic diagram showing another equivalent circuit of a pixel unit according to an embodiment of the present application.

FIG. 3A shows a schematic diagram showing an equivalent circuit of another pixel unit according to the embodiments of the present application. The pixel unit shown in FIG. 3A includes a charge collecting area 101, a transmission gate 102, a floating diffusion node 103, an electric potential adjustment area, a power source $V_{DD}$, a power source $V_{DD1}$ and a power source $V_{DD2}$. The electric potential adjustment area is a polycrystalline resistor. The electric potential adjustment area is divided into six sub-areas 4 and these sub-areas 4 are independent from each other. The sub-areas 4 are divided into three groups and arranged symmetrically on both sides of the electric potential adjustment area. The three groups of sub-areas 4 are respectively connected to the power source $V_{DD}$, the power source $V_{DD1}$ and the power source $V_{DD2}$. A voltage of the power source connected to different groups of sub-areas 4 in the charge collecting area 101 along the transferring direction of charge gradually increases, ie. $V_{DD}>V_{DD1}>V_{DD2}$.

Figure 3B:
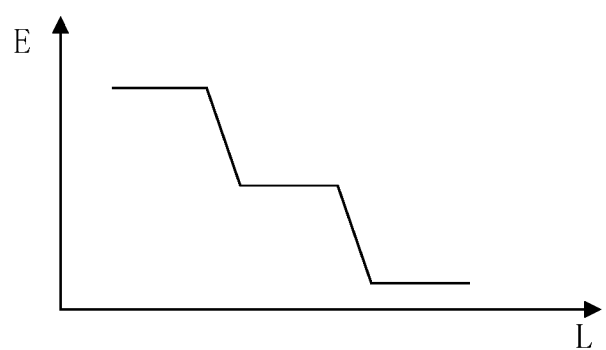
FIG. 3B is a schematic diagram showing another electric potential change trend in a charge collecting area according to an embodiment of the present application.

An electric potential change along the transferring direction of charge in the charge collecting area 101 shown in FIG. 3A shows a step downward trend, which is shown in FIG. 3B. It should be understood that the electric potential between different groups of sub-areas 4 is different, which gives rise to the electric potential change along the transferring direction of charge in the charge collecting area 101 showing a step downward trend.

It should be noted that the electric potential in the charge collecting area composed of the plurality of blocky polycrystalline resistors in the two implementations both shows the step downward trend, however the causes of the step downward trend are different.

The pixel unit provided in the present application forms a modulated electric field by arranging the electric potential adjustment area at the periphery of the charge collecting area so as to directionally transfer the photo-generated charge under the influence of the modulated electric field. This is able to improve the speed and the efficiency of the transferring, avoid image trailing, and improves the response speed and the measurement accuracy of the photoelectric sensor.

Figure 4:
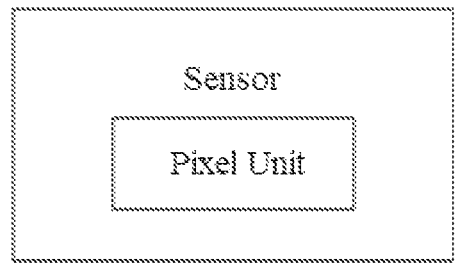
FIG. 4 is a schematic diagram showing a sensor according to an embodiment of the present application.

As shown in FIG. 4, the present application further provides a sensor, which includes a plurality of pixel units shown in FIG. 1A, or the sensor includes a plurality of pixel units shown in FIG. 2A, or the sensor includes a plurality of pixel units shown in FIG. 3A.

Figure 5:
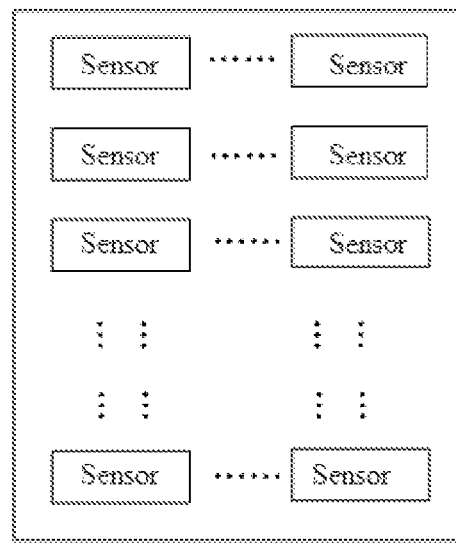
FIG. 5 is a schematic diagram showing a sensing array according to an embodiment of the present application.

As shown in FIG. 5, the present application further provides a sensing array, which includes a plurality of sensors shown in FIG. 4, or the sensing array includes a plurality of pixel units shown in FIG. TA, or the sensing array includes a plurality of pixel units shown in FIG. 2A, or the sensing array includes a plurality of pixel units shown in FIG. 3A. Optionally, the sensing array may have M rows and N columns, where M and N both stand for positive integers.

It should be noted that although a plurality of units/modules or sub-units/modules of the device are mentioned in the above detailed description, this division is only exemplary and not mandatory. In fact, according to the embodiments of the present application, the features and functions of two or more units/modules described above can be embodied in one unit/module. Conversely, the features and functions of one unit/module described above can be further divided into multiple units/modules to be embodied.

In addition, although the operations of the method of the present application are described in a specific order in the drawings, this does not require or imply that these operations must be performed in the specific order, or that all the operations shown must be performed to achieve the desired result. Additionally or alternatively, some steps may be omitted, multiple steps may be combined into one step for execution, and/or one step may be decomposed into multiple steps for execution.

Although the spirit and principle of the present application have been described with reference to several specific embodiments, it should be understood that the present application is not limited to the specific embodiments disclosed, and the division of various aspects does not mean that the features in these aspects cannot be combined. Benefit, this division is only for the convenience of presentation. This application is intended to cover various modifications and equivalent arrangements included within the spirit and scope of the appended claims.

What is claimed is:

1. A pixel unit comprising:
   a charge collecting area configured to receive radiation to generate photo-generated charge;
   a floating diffusion node configured to store and output the photo-generated charge generated in the charge collecting area;
   a transmission gate connected between the charge collecting area and the floating diffusion node and configured to transfer the photo-generated charge from the charge collecting area to the floating diffusion node;
   an electric potential adjustment area disposed at a periphery of the charge collecting area and configured to concentrate the photo-generated charge to a side of a connection between the charge collecting area and the transmission gate,
   wherein the electric potential adjustment area is composed of a polycrystalline resistor and a shape of the polycrystalline resistor is strip or blocky,
   wherein if the electric potential adjustment area is composed of a plurality of blocky polycrystalline resistors, the plurality of blocky polycrystalline resistors is interconnected through a metal conductor, or there is no interconnection between the plurality of blocky polycrystalline resistors, and
   wherein the closer the distance between the electric potential adjustment area and the transmission gate is, the lower the potential is.

2. The pixel unit of claim 1, wherein a power source is connected to the electric potential adjustment area, the electric potential adjustment area comprises at least two sub-adjustment areas, and a connection between the at least two sub-adjustment areas is at earth potential.

3. The pixel unit of claim 2, wherein if the electric potential adjustment area is composed of the plurality of blocky polycrystalline resistors and the metal conductor, the number of the power source will thus be one, and wherein the power source is respectively connected to one end of the at least two sub-adjustment areas closed to the transmission gate.

4. The pixel unit of claim 2, wherein if the electric potential adjustment area is composed of the plurality of blocky polycrystalline resistors and there is no connection between the plurality of blocky polycrystalline resistors, the number of the power source will thus be plural, different blocky polycrystalline resistors of the plurality of blocky polycrystalline resistors are connected to different power sources, and the closer the blocky polycrystalline resistor is to the transmission gate, the greater a voltage of the power source connected to the closer blocky polycrystalline resistor is.

5. A sensor comprising the pixel unit of claim 1.

6. A sensing array comprising a plurality of the sensors of claim 5.

7. A sensing array comprising a plurality of the pixel units of claim 1.

8. The pixel unit of claim 1, wherein a power source is connected to the electric potential adjustment area, the electric potential adjustment area comprises at least two sub-adjustment areas, and a connection between the at least two sub-adjustment areas is at earth potential.

9. A pixel unit comprising:
   a charge collecting area configured to receive radiation to generate photo-generated charge;
   a floating diffusion nod configured to store and output the photo-generated charge generated in the charge collecting area;
   a transmission gate connected between the charge collecting area and the floating diffusion nod and configured to transfer the photo-generated charge from the charge collecting area to the floating diffusion nod;
   an electric potential adjustment area disposed at a periphery of the charge collecting area and configured to concentrate the photo-generated charge to a side of a connection between the charge collecting area and the transmission gate,
   wherein the closer the distance between the electric potential adjustment area and the transmission gate is, the lower the potential is,
   wherein the electric potential adjustment area is composed of a polycrystalline resistor and a shape of the polycrystalline resistor is strip or blocky,
   wherein if the electric potential adjustment area is composed of a strip-shaped polycrystalline resistor and the number of a power source connected to an electric potential adjustment area is one, the electric potential adjustment area thus comprises at least two sub-adjustment areas, and the power source is respectively connected to one end of the at least two sub-adjustment areas closed to the transmission gate, and
   wherein a connection between the at least two sub-adjustment areas is at earth potential.

* * * * *